US006959049B2

(12) United States Patent
Staszewski et al.

(10) Patent No.: US 6,959,049 B2
(45) Date of Patent: Oct. 25, 2005

(54) MULTI-TAP, DIGITAL-PULSE-DRIVEN MIXER

(75) Inventors: Robert B. Staszewski, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 631 days.

(21) Appl. No.: 09/828,338

(22) Filed: Apr. 6, 2001

(65) Prior Publication Data

US 2001/0038672 A1 Nov. 8, 2001

Related U.S. Application Data

(60) Provisional application No. 60/195,926, filed on Apr. 10, 2000.

(51) Int. Cl.[7] .......................... H03K 9/00; H04L 27/08; H04B 1/16
(52) U.S. Cl. ........................ 375/316; 375/345; 455/334
(58) Field of Search ................................ 375/316, 345; 455/234, 334; 341/143

(56) References Cited

U.S. PATENT DOCUMENTS

| | | | |
|---|---|---|---|
| 4,789,837 A | 12/1988 | Ridgers | |
| 5,414,729 A | * 5/1995 | Fenton | ........................ 375/149 |
| 5,640,698 A | 6/1997 | Shen et al. | |
| 5,801,654 A | 9/1998 | Traylor | |
| 5,982,315 A | * 11/1999 | Bazarjani et al. | ............ 341/143 |
| 6,049,706 A | 4/2000 | Cook et al. | .................. 455/313 |
| 6,075,820 A | * 6/2000 | Comino et al. | ............... 375/245 |
| 6,337,885 B1 | * 1/2002 | Hellberg | ...................... 375/316 |
| 6,438,366 B1 | * 8/2002 | Lindfors et al. | ............. 455/334 |

FOREIGN PATENT DOCUMENTS

FR    2 616 984    12/1988

OTHER PUBLICATIONS

Copy of copending U.S. Appl. No. 09/850,435 filed on May 7, 2001 (Docket TI–31020).

* cited by examiner

*Primary Examiner*—Amanda Le
*Assistant Examiner*—Cicely Ware
(74) *Attorney, Agent, or Firm*—Ronald O. Neerings; Wade James Brandy, III; Frederick J. Telecky, Jr.

(57) ABSTRACT

A multi-tap, digital-pulse-driven mixer advantageously avoids local oscillator (11) leakage by shifting the local oscillator frequency ($F_{LO}$) out of the received frequency band. Low noise figures are advantageously realized by the use of digital pulses (51, 52) as mixer drive signals (16).

28 Claims, 5 Drawing Sheets

MULTI-TAP, DIGITAL-PULSE-DRIVEN MIXER

This application claims the priority under 35 U.S.C. 119(e)(1) of now abandoned U.S. provisional application No. 60/195,926 filed on Apr. 10, 2000.

FIELD OF THE INVENTION

The invention relates generally to frequency channel communications and, more particularly, to mixers for downconverting the frequency of a received communication signal.

BACKGROUND OF THE INVENTION

Among conventional RF-to-IF (radio frequency-to-intermediate frequency) mixers, zero-IF implementations have the inherent problem of LO (local oscillator) leakage through the mixer to the RF input, which then gets downconverted inside the mixer. One solution currently in discussion to solve this problem is to use a sub-harmonic pumped mixer for the down conversion. Such a mixer either requires very high LO drive currents or suffers from undesirably high noise figures. The sub-harmonic pumped mixer also generates the needed RF frequency internally, so there is still a LO leakage problem with this architecture. For low IF implementations, the realization of 90 degree phase splitters is one of the biggest challenges.

It is therefore desirable to provide a mixer that avoids the aforementioned disadvantages of conventional approaches.

SUMMARY OF THE INVENTION

The present invention provides a multi-tap, digital-pulse-driven mixer which advantageously avoids LO leakage by shifting the LO frequency out of the receive frequency band, and which advantageously realizes low noise figures by the use of digital pulses as mixer drive signals.

DETAILED DESCRIPTION

If a mixer, such as an RF-to-IF mixer, is driven using a digital pulse with rise and fall times that are small compared to the pulse width, the needed voltage swing can be reduced. For a resistive mixer, which is equivalent to a sampling switch, the needed voltage swing above $V_{th}$ is determined by the $g_m$ saturation at low $V_{ds}$, because the maximum signal swing at that point in, for example a wireless system, is limited to 50 mV. Therefore 150 to 200 mV will be sufficient. The voltage swing needed below $V_{th}$ is determined by the off current needed and will be around 300–400 mV. Therefore a total voltage swing of 500–600 mV will be sufficient. This voltage swing can be realized, for example, by local power regulation of the driving inverter. When comparing that situation to, for example, an analog mixer drive circuit with a sinusoidal drive waveform and wherein the needed overdrive voltage is small, one can obtain an equivalent analog voltage amplitude by calculating waveforms with equal voltage derivatives at zero crossing points:

$$dV_{ana}/dt = dV_{dg}/dt \qquad \text{Equation 1}$$

$$d(V_{pp}/2 * \sin(\omega t))/dt = V_S/t_{tr} \qquad \text{Equation 2}$$

$$V_{pp} = V_S * 1/\pi * (T_{RF}/t_{tr}) \qquad \text{Equation 3}$$

where $V_S$ is the digital voltage swing and $t_{tr}$ is the digital transition (rise/fall) time.

Equation 3 shows that a factor of $1/\pi*(T_{RF}/t_{tr})$ is gained with respect to voltage swing. For typical inverter delays of 20 psec for a conventional Texas Instruments deep-submicron CMOS process with $L_g=0.13$ micrometers, the gain with a digital-pulse-driven mixer can be around a factor of 10 compared to an analog implementation.

The current consumption needed by a digital drive circuit can also be calculated. The mean current consumption for one digital pulse with a repetition rate $T_{rep}$, is given by:

$$I_{mean} = 2 * V_S * (C_{load} + C_{par} + C_{inv})/T_{rep} \qquad \text{Equation 4}$$

where $C_{load}$ is the capacitance of the sampling switch, $C_{par}$ is the parasitic capacitance of the wiring and $C_{inv}$ is the output capacitance of, for example, a driving inverter. It is important to notice that the current consumption is independent of $t_{tr}$, while the noise figure of the circuit goes down with $t_{tr}$. The size of $C_{load}$ is determined by the needed on resistance $R_{on}$ of the sampling switch, which should be a factor of 10 lower than the input impedance of the first IF amplifier. To meet typical noise floor requirements with an exemplary LNA gain of 20 dB, an input impedance around 500 Ohm or a sample switch $g_m$ of around 50 Ohm is required. With a typical $g_m$ of 3 mS/um, a 50 um wide transistor is needed, which has an input capacitance of 40 fF. The typical output capacitance of an inverter is very similar, and the interconnection parasitic can be kept below 5 fF with suitable attention to the layout. This gives total current consumption of 0.25 mA.

Figure 1:
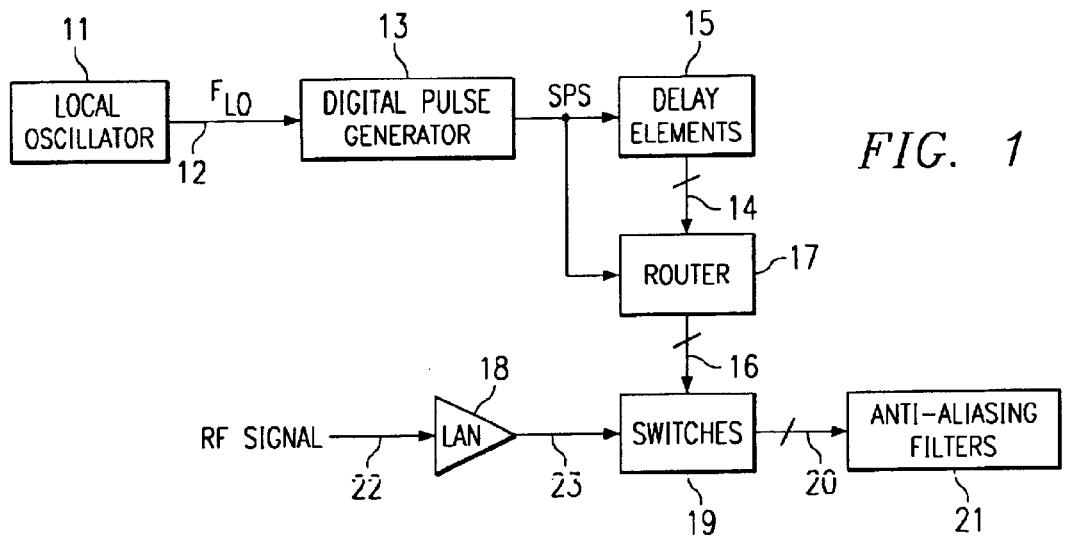
FIG. 1 diagrammatically illustrates an exemplary mixer embodiment according to the invention.

FIG. 1 diagrammatically illustrates an exemplary embodiment of a mixer according to the present invention for downconverting a communication signal from RF (radio frequency) to IF (intermediate frequency). The exemplary embodiment of FIG. 1 is a digital-pulse-driven mixer which can, accordingly, realize one or more of the aforementioned advantageous characteristics associated with a digital-pulse-driven design. In FIG. 1, an RF communication signal input 22 is applied to a low noise amplifier (LNA) 18 whose output 23 is in turn applied to a plurality of sampling switches 19. In response to a plurality of digital control signals 16, the sampling switches at 19 sample the amplified RF signal 23. The switches 19 output the sampled RF signal at 20 to anti-aliasing filters 21, which produce the IF signal.

A local oscillator 11 produces a synthesized frequency signal 12 having a frequency $F_{LO}$. This local oscillator signal 12 is input to a digital pulse generator 13 which produces in response thereto a sampling pulse signal SPS which is in turn input to a section of delay elements 15. A router 17 is coupled to receive signals 14 from the outputs of the respective delay elements at 15, and the router 17 also receives the sampling pulse signal SPS. The router 17 suitably routes the signals 14 and the sampling pulse signal SPS to drive the various digital control signals 16 and thereby control the sampling switches 19 as desired. The router 17 and switches 19 thus provide a sampler for sampling the RF signal 23.

Figure 2:
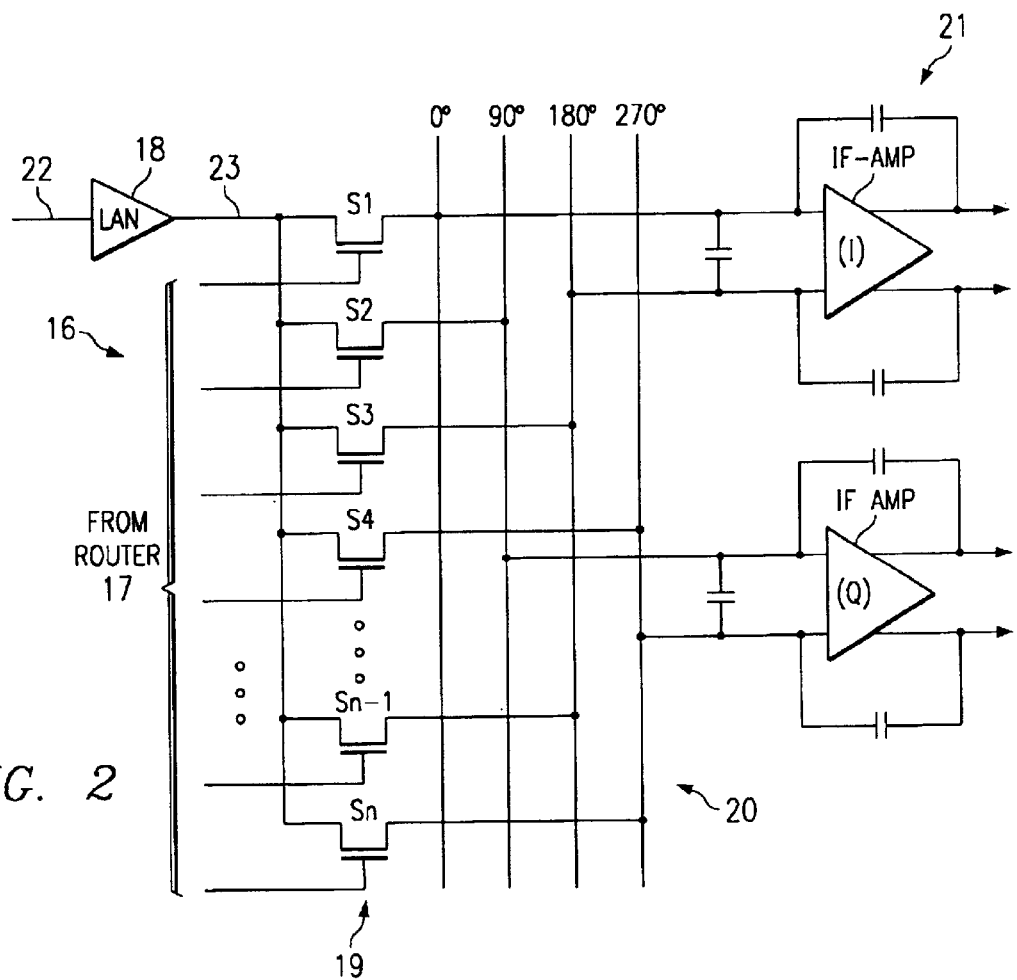
FIG. 2 diagrammatically illustrates exemplary embodiments of the switches and anti-aliasing filters of FIG. 1.

FIG. 2 diagrammatically illustrates exemplary embodiments of selected portions of the mixer of FIG. 1. In the example of FIG. 2, the switches 19 are provided as CMOS pass gates controlled by the digital signals 16 produced by the router 17. The exemplary embodiment of FIG. 2 includes n switches S1–Sn, where n=M×4 and M is an integer. The switches 19 are partitioned into M groups of 4 switches, the switches S1–S4 being exemplary of one such group. As shown in FIG. 2, switch S1 samples the RF input signal 23 at a phase of 0°, switch S2 samples at a phase of 90°, switch S3 samples at 180°, and switch S4 samples at 270°. Similarly, switches S5, S9 . . . Sn−3 sample at 0°, switches S6, S10, . . . Sn−2 sample at 90°, switches S7, S11, . . . Sn−1 sample at 180°, and switches S8, S12, . . . Sn sample at 270°. The sampled phases are input to appropriate anti-aliasing filters 21 which recombine the sampled phases. In the example of FIG. 2, the anti-aliasing filters 21 are conventional third-order low-pass filters, one of which includes an in-phase IF amplifier I that receives phases 0° and 180°, and the other of which includes a quadrature IF amplifier Q that receives phases 90° and 270°. The outputs of the filters 21 can be applied to, for example, a conventional ΣΔ multi-bit A/D converter (not shown).

Referring also to FIG. 1, n−1 of the n digital control signals 16 are provided as delayed versions of a pulse (or pulses) of the sampling pulse signal SPS, and one of the control signals 16 is the pulse (or one of the pulses) from which the delayed versions are produced. For example, if switch S1 is controlled by a given SPS pulse, then switches S2–Sn can be driven by respective delayed versions of that SPS pulse. If each of the four phases is sampled during each cycle of the RF input signal 23, then a new SPS pulse will be needed approximately every M (=n/4) cycles of the signal 23.

Figure 3:
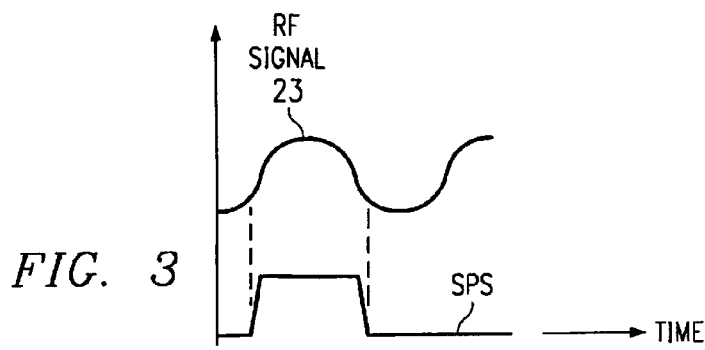
FIG. 3 graphically illustrates an exemplary timing relationship between the RF signal of FIG. 1 and the sampling pulse signal of FIG. 1.

Advantageously according to the invention, the SPS pulses have a pulse width which is approximately equal to but slightly larger than the half period of the RF input signal, as illustrated generally in FIG. 3. The FIG. 3 relationship between the SPS pulse width and the half period of the RF input signal can advantageously reduce the noise figure of the mixer, because the switching point of at least some of the pulses which control the sampling operations of switches S1–Sn (see also FIG. 2) can be made exactly aligned with the zero crossings of the RF signal 23, which allows implementation of coherent detection. As one example, the SPS pulse width can be [(n+1)/n]×(half period of RF input signal). In this example, the relationship of the frequency $F_{LO}$ of the local oscillator output 12 (see also FIG. 1) to the frequency $F_{RF}$ of the RF input signal should be: $F_{LO}=F_{RF} \times [n/(n+1)]$. The digital pulse generator 13 of FIG. 1 can then utilize well-known conventional techniques to produce the sampling pulse signal SPS having a pulse duration of [(n+1)/n]×(half period of RF input signal) and such that the SPS pulse is repeated every M cycles of the local oscillator output 12.

Due to the above-described exemplary relationship between $F_{LO}$ and $F_{RF}$, the length of each cycle of the local oscillator output 12 will be [1+(1/n)]×(period of the RF input signal). Recalling that the spacing between SPS pulses is M cycles of the local oscillator output 12, and recalling that M=n/4, the timing relationship of the (j+1)th SPS pulse with respect to the RF input signal will be delayed by ¼ of a cycle of the RF input signal when compared to the timing relationship of the immediately preceding (jth) SPS pulse with respect to the RF input signal. This ¼ of a cycle delay is due to the fact that the local oscillator signal 12 "loses" (1/n)th of a cycle (relative to the RF signal 23) during each of the M=n/4 cycles between SPS pulses, and $$\frac{1}{n} \times \frac{n}{4} = \frac{1}{4}.$$

This delay between adjacent SPS pulses can be compensated for in the design of the delay elements 15 and the router 17 of FIG. 1, as described in detail below.

Figure 4:
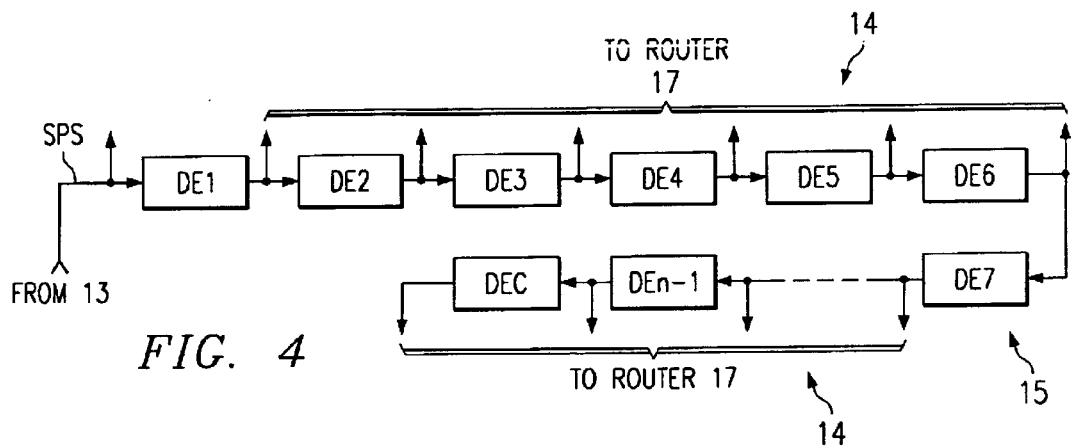
FIG. 4 diagrammatically illustrates an exemplary embodiment of the delay element section of FIG. 1.

FIG. 4 diagrammatically illustrates an exemplary embodiment of the delay element section 15 of FIG. 1. The embodiment of FIG. 4 includes a plurality of delay elements DE1–DEn−1 and DEC connected in series to form a delay chain. In some embodiments, each of the illustrated delay elements provides a delay of ¼ cycle of the RF input signal 23. Referring also to FIGS. 1 and 2, the router 17 can route SPS to control switch S1, and can also route the outputs of delay elements DE1–DEn−1 to respectively control switches S2–Sn. Because each of the delay elements delays the input SPS pulse by ¼ of a cycle of the RF input signal, the SPS pulse and the respective ¼ cycle delayed versions thereof can control switches S1–Sn to sample at the appropriate phases of the RF input signal.

For example, the SPS pulse can be used to control switch S1 to sample at 0°, the output of delay element DE1 can be used to control switch S2 to sample at 90°, the output of delay element DE2 can be used to control switch S3 to sample at 180°, and the output of delay element DE3 can be used to control switch S4 to sample at 270°. The delay element DE4 can be used to control the next switch S5 (not illustrated in FIG. 2) to sample at 0° of the next cycle of the RF input signal 23, and so on until delay element DEn−1 controls switch Sn to sample at 270° of the Mth cycle of signal 23. This exemplary operation is illustrated generally in FIG. 5.

Figure 5:
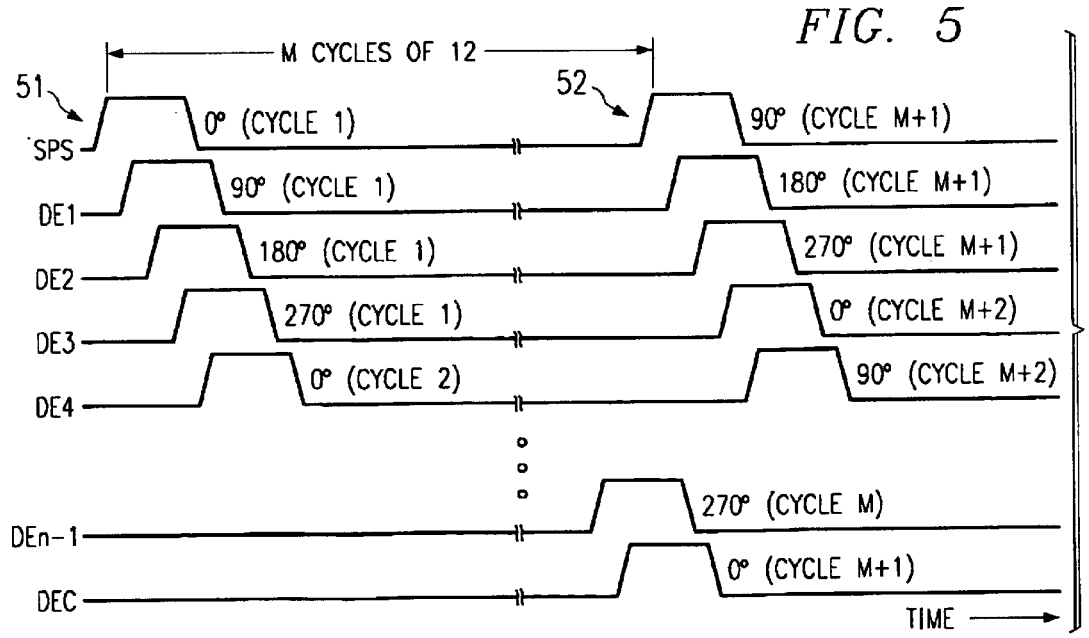
FIG. 5 graphically illustrates examples of various signals from FIG. 4, their mutual timing relationships, and their respective timing relationships relative to the RF signal of FIG. 1.

As shown in FIG. 5, the SPS pulse 51 provides for sampling at 0° of cycle 1 of the RF signal 23 and the sampling continues at 90° phase increments through the sampling at 270° of cycle M by delay element DEn−1. As mentioned above, however, after M cycles of the local oscillator output 12, the timing relationship of the next SPS pulse 52 with respect to the RF input signal 23 will be delayed by ¼ cycle (90° phase) as compared to the timing relationship of the SPS pulse 51 with respect to the RF input signal 23. Thus, as illustrated in FIG. 5, the SPS pulse 52 will not be available to sample at 0° of cycle M+1 of the RF input signal, but rather will be available ¼ of a cycle later to sample at 90° of cycle M+1. Accordingly, the router 17 of FIG. 1 can route the SPS pulse 52 to switch S2 of FIG. 2 for sampling at 90° of cycle M+1. The sampling at 0° of cycle M+1 is controlled by the pulse output from the compensating delay element DEC, which the router 17 routes to control the switch S1 of FIG. 2. The output of DE1 is routed to switch S3 to sample at 180° of cycle M+1, the output of DE2 is routed to switch S4 to sample at 270° of cycle M+1, and so on as illustrated in FIG. 5.

Figure 6:
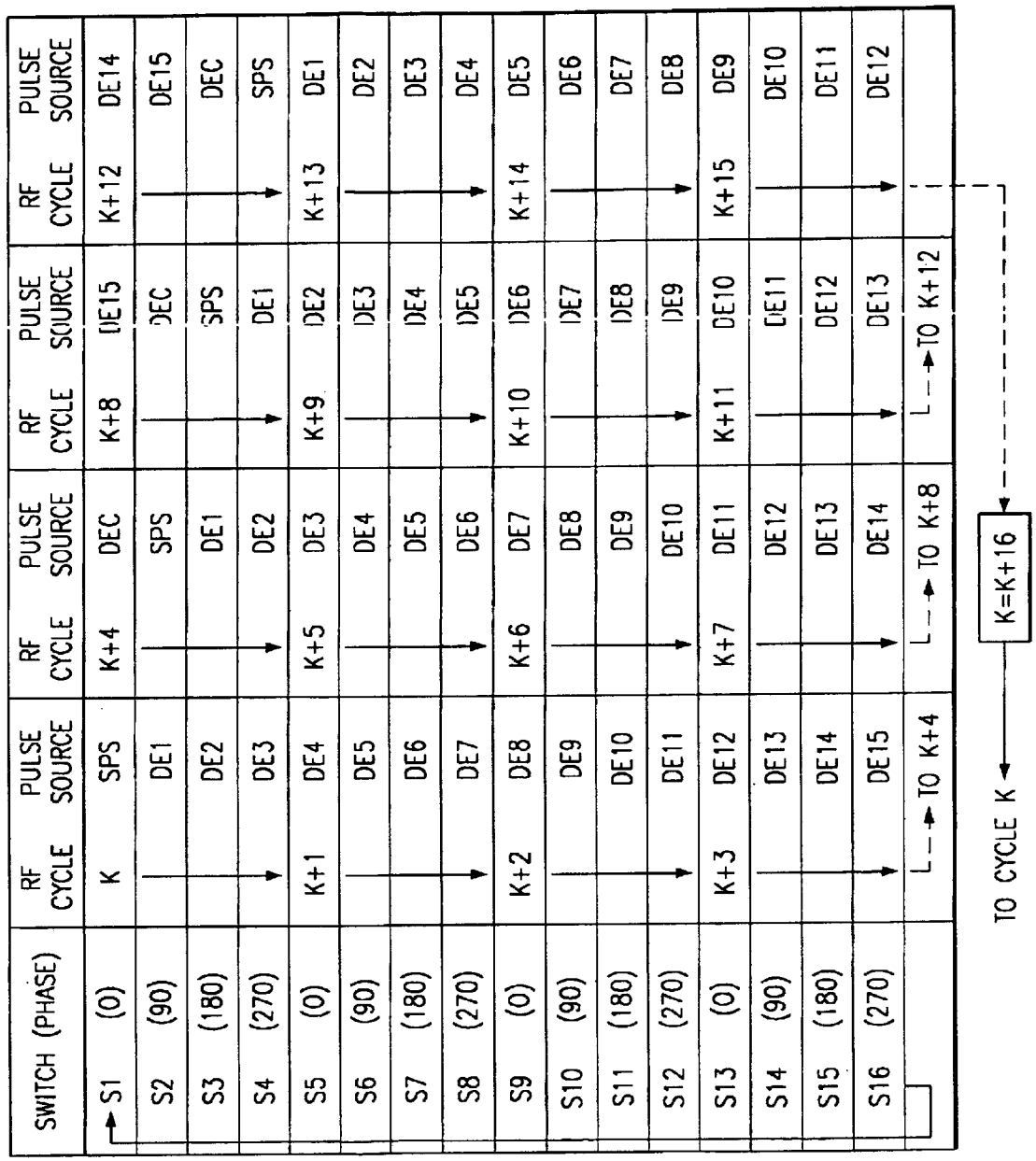
FIG. 6 illustrates in tabular format exemplary operations of the router of FIG. 1.

FIG. 6 illustrates in tabular format exemplary operations which can be performed by the router 17 of FIG. 1 to control the sampling switches at 19 in FIG. 2. The example of FIG. 6 is for n=16 switches partitioned into M=4 groups of 4 switches each, each group of 4 switches operable for sampling the desired 4 phases of an associated cycle of the RF input signal. Also in the FIG. 6 example, $F_{LO}=F_{RF}\times[n/(n+1)]=F_{RF}\times(16/17)$. As shown in FIG. 6, for a given cycle K of the RF input signal, the SPS pulse (e.g., 51 in FIG. 5) is used to control switch S1 to sample at 0°, and the respective delay elements DE1–DE15 are used to control the respective switches S2–S16 to sample as shown in cycles K through K+3. In cycle K+4, the output of DEC is used to control switch S1 to sample at 0°, the SPS pulse (e.g., 52 in FIG. 5) is used to control switch S2 to sample at 90°, and the respective outputs of DE1–DE14 are used to control the respective sampling operations of the switches S3–S16 in the remainder of cycle K+4 and in cycles K+5 through K+7.

In cycle K+8, the output of DE15 is used to control switch S1 to sample at 0°, the output of DEC is used to control switch S2 for sampling at 90°, and the SPS pulse is used to control switch S3 for sampling at 180°. The output of DE1 is used to control S4 for sampling at 270° during cycle K+8, and the respective outputs of DE2–DE13 are used to control the sampling operations of the respective switches S5–S16 in cycles K+9 through K+1. In cycle K+12, the output of DE14 drives switch S1 to sample at 0°, the output of DE15 drives switch S2 to sample at 90°, the output of DEC drives switch S3 to sample at 180°, and the SPS pulse drives S4 to sample at 270°. The respective outputs of DE1–DE12 are used to control the respective sampling operations of switches S5–S16 in cycles K+13 through K+15.

In the next cycle of the RF input signal, namely cycle K+16, the SPS pulse will be back in proper position relative to the RF input signal for controlling switch S1, S5, S9 or S13 to sample at 0°. This is because, in this example, after 16 cycles (K through K+15) of the RF input signal, the SPS pulse now "lags" the RF input signal by 16×⅟16=1 cycle, and is thus back in its "original" phase (i.e., its cycle K phase) relative to the RF signal. Accordingly, after cycle K+15, the operations in FIG. 6 can, for example, return to cycle K and repeat (in which case the SPS pulse would control switch S1 again).

The router 17 can be readily implemented, for example, utilizing a passive pass gate design including a matrix of CMOS pass gates controlled by bits in a plurality of n-bit registers. In the example of FIG. 6, a total of four n-bit registers can be used, each register corresponding to a respective one of the four routing schemes shown in FIG. 6. The registers can be sequentially enabled (one every $4^{th}$ RF cycle) in the cyclic pattern illustrated in FIG. 6.

Figure 7:
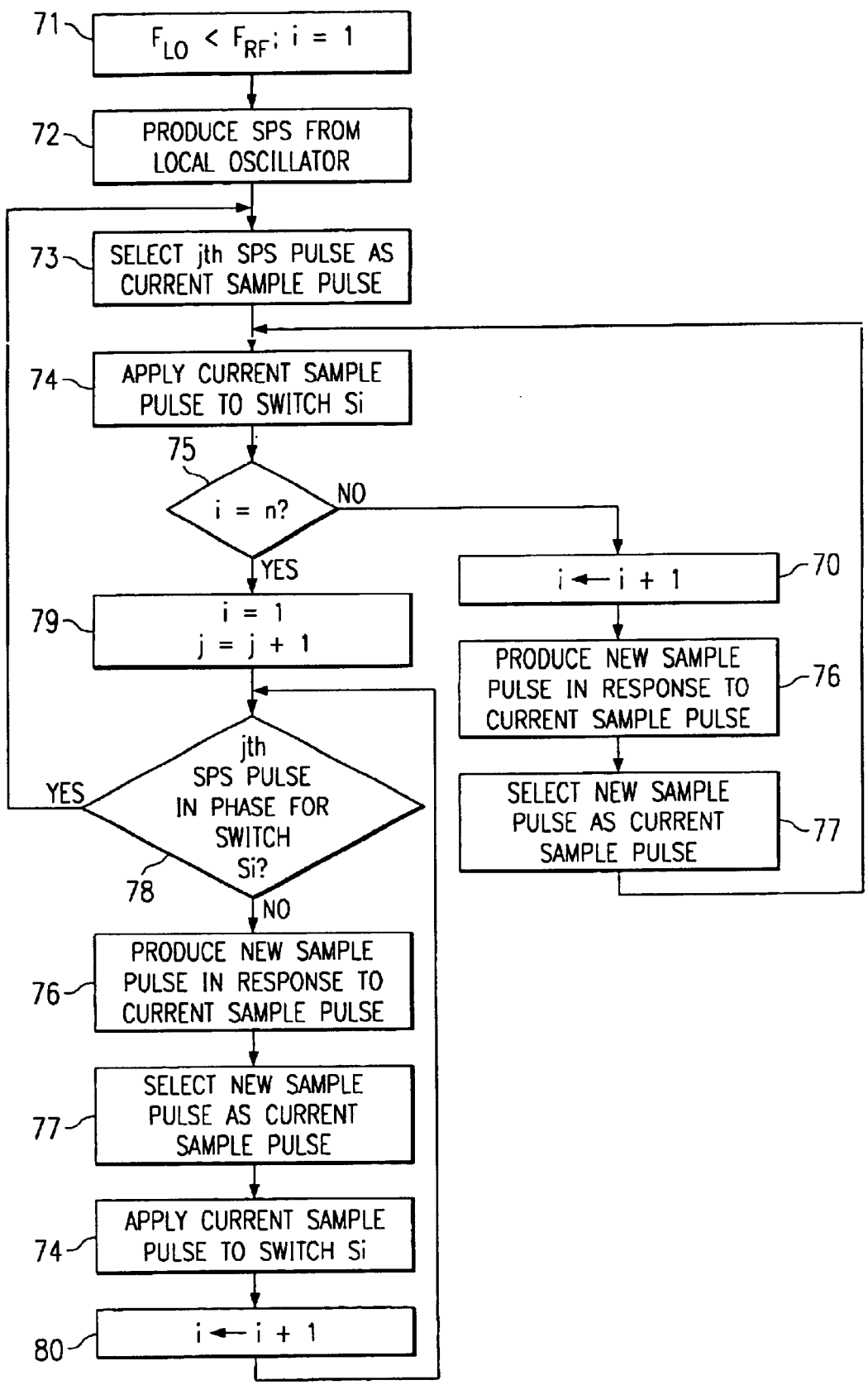
FIG. 7 illustrates exemplary operations which can be performed by the embodiments of FIGS. 1–6.

FIG. 7 illustrates exemplary operations which can be performed by the embodiments illustrated in FIGS. 1–6. At 71, the local oscillator frequency $F_{LO}$ is set to be less than the frequency $F_{RF}$ of the RF input signal, and a sample switch index i is set to 1. At 72, the sampling pulse signal SPS is produced from the local oscillator. At 73, the jth SPS pulse is selected as the current sample pulse, and is applied to switch Si at 74. For example, the jth SPS pulse can be applied to switch S1 in order to sample at 0°. Thereafter, if it is determined at 75 that switch Sn has not yet been operated, then the next switch is selected at 70 by incrementing the switch index i. Thereafter at 76, a new sample pulse is produced in response to the current sample pulse, for example by producing a delayed version of the SPS pulse that was selected at 73. At 77, the new sample pulse is selected as the current sample pulse, and the current sample pulse is applied to switch Si at 74. The above-described operations at 70 and 74–77 are repeated until it is determined at 75 that all n switches have been operated.

When it is determined at 75 that all n switches have been operated, at 79 the sampling switch index i is again set equal to 1, and the SPS pulse index j is incremented. It is thereafter determined at 78 whether the jth SPS pulse is in phase for the assigned sampling operation of switch Si. If not, then the operations described above and illustrated at 76, 77 and 74 are sequentially executed in that order. Thereafter, the sampling switch index i is incremented at 80, after which it is determined at 78 whether the jth SPS pulse is in the appropriate phase for controlling the assigned sampling operation of switch Si. If not, then the aforementioned sequence of operations 76, 77, 74, 80 and 78 are repeated. However, if the jth SPS pulse is determined at 78 to be in the appropriate phase for controlling the assigned sampling operation of switch Si, then the jth SPS pulse is at 73 selected to be the current sample pulse. Thereafter, operations beginning at 74 are repeated again as described above.

Figure 8:
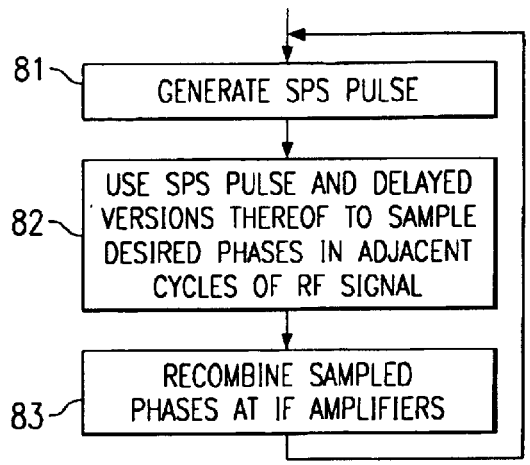
FIG. 8 illustrates exemplary operations which can be performed by the embodiments of FIGS. 1–6.

FIG. 8 illustrates exemplary operations which can be performed by the embodiments of FIGS. 1–6. After generation of an SPS pulse at 81, that pulse and delayed versions thereof are used at 82 to sample desired phases in adjacent cycles of the RF signal. The sampled phases are recombined at 83 to produce the desired downconverted signal.

Figure 9:
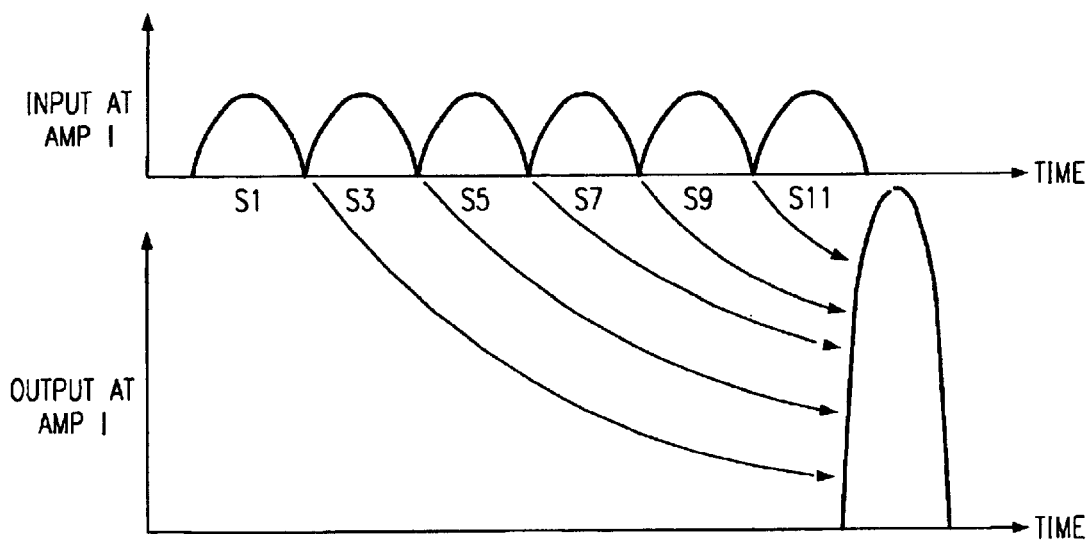
FIGS. 9 and 10 graphically illustrate exemplary signals of FIG. 1.

As will be evident to workers in the art, the embodiments of FIGS. 1–8 can be used to realize a zero-IF or near-zero-IF receiver architecture wherein the frequency of the local oscillator is advantageously shifted away from the frequency of the RF input signal by a factor such as n/(n+1). For example, in the case of a Bluetooth receiver with n=16, the oscillator frequency is 2.25 GHz for an RF input frequency of 2.4 GHz, and the oscillator frequency is 2.34 GHz for an RF input frequency of 2.5 GHz. Thus, the frequency of the local oscillator lies outside of the Bluetooth frequency band, which insures that any leakage from the local oscillator is suppressed by the Bluetooth antenna filter, and also insures that no other channel is folded into the downconverted signal. The local oscillator can therefore be advantageously integrated without the leakage problem of conventional arrangements. Also, the delay elements can be realized, for example, by a suitable inverter chain, which advantageously requires a much smaller silicon area than conventional polyphase networks. Furthermore, because all desired phases of each cycle of the RF input signal are sampled and recombined in the IF amplifier, there is no signal loss as compared to a conventional sub-sampling scheme. This is illustrated by FIG. 9, which shows the in-phase path.

Figure 10:
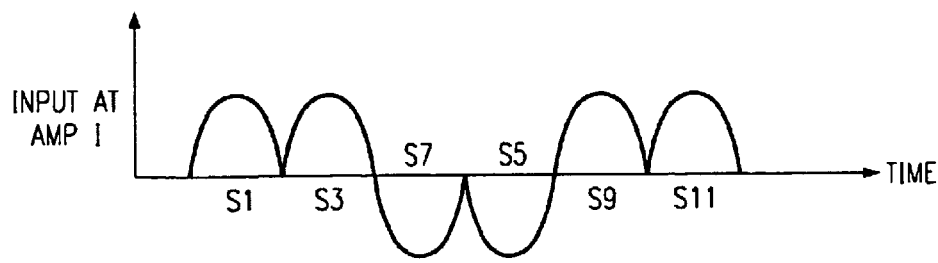

In some embodiments, the router 17 can control the switches 19 to generate an SC (switched capacitor) filter function during the phase sampling operations. In this manner, undesired interferers can be advantageously attenuated during the sampled-phase recombination operations of the IF amplifiers. An example of this is illustrated by FIG. 10, wherein the switch activation sequence is modified as shown (S5 and S7 are reversed with respect to the sequence of FIG. 9) to support a desired SC filter function.

Although exemplary embodiments of the invention are described above in detail, this does not limit the scope of the invention, which can be practiced in a variety of embodiments.

What is claimed is:

1. A method of downconverting a first communication signal at a first frequency into a second communication signal at a second frequency that is lower than the first frequency, comprising:

providing an oscillator signal having a third frequency that is lower than the first frequency;

producing in response to the oscillator signal a sampling pulse signal having digital pulses for use in sampling the first communication signal, wherein adjacent pulses of the sampling pulse signal are separated by an amount of time that corresponds to a predetermined number of cycles of the first communication signal and wherein said amount of time is greater than an amount of time required for completion of said predetermined number of cycles of the first communication signal;

using the pulses of the sampling pulse signal to sample selected phases of the first communication signal, including using a first pulse of the sampling pulse signal to sample a first chase of a first cycle of the first communication signal and using a second pulse of the sampling pulse signal to sample a second phase of a second cycle of the first communication signal in which said first and second pulses are adjacent one another in the sampling pulse signal, wherein said second phase is a different phase than said first phase, and wherein said second cycle follows said first cycle by a number of cycles of the first communication signal equal to said predetermined number; and using the sampled phases to produce the second communication signal.

2. The method of claim 1, wherein the first communication signal is an RF communication signal.

3. The method of claim 1, wherein said first-mentioned using step includes using a delayed version of said first pulse to sample said first phase of said second cycle.

4. The method of claim 1, wherein said first-mentioned using step includes using a third pulse of the sampling pulse signal to sample said first phase of a third cycle of the first communication signal, and wherein said third cycle follows said second cycle.

5. The method of claim 4, wherein said third cycle follows said first cycle by a number of cycles of the first communication signal that is a multiple of said predetermined number.

6. The method of claim 5, wherein said first-mentioned using step includes using a delayed version of said first pulse to sample said first phase of said second cycle.

7. The method of claim 4, wherein said first-mentioned using step includes using a delayed version of said first pulse to sample said first phase of said second cycle.

8. The method of claim 1, wherein said step of using pulses includes using a first pulse of the sampling pulse signal and a plurality of delayed versions of said first pulse to sample selected phases of the first communication signal.

9. A method of downconverting a first communication signal at a first frequency into a second communication signal at a second frequency that is lower than the first frequency, comprising:

sampling a plurality of phases of each of at least two consecutive cycles of the first communication signal, wherein said sampling step includes normally activating a plurality of sampling switches in a first temporal order to sample said plurality of phases, and providing said filter function by activating said plurality of switches in a second temporal order that differs from said first temporal order; and combining the sampled phases to provide a filter function and produce the second communication signal.

10. An apparatus for downconverting a first communication signal at a first frequency into a second communication signal at a second frequency that is lower than the first frequency, comprising:

an oscillator for generating a signal having a third frequency that is lower than the first frequency;

circuitry for producing in response to the oscillator signal a sampling pulse signal having digital pulses for use in sampling the first communication signal, wherein adjacent pulses of the sampling pulse signal are separated by an amount of time that corresponds to a predetermined number of cycles of the first communication signal and wherein said amount of time is greater than an amount of time required for completion of said predetermined number of cycles of the first communication signal;

circuitry for using the pulses of the sampling pulse signal to sample selected phases of the first communication signal, including using a first pulse of the sampling pulse signal to sample a first phase of a first cycle of the first communication signal and using a second pulse of the sampling pulse signal to sample a second phase of a second cycle of the first communication signal in which said first and second pulses are adjacent one another in the sampling pulse signal, wherein said second phase is a different phase than said first phase, and wherein said second cycle follows said first cycle by a number of cycles of the first communication signal equal to said predetermined number; and circuitry for using the sampled phases to produce the second communication signal.

11. The apparatus of claim 10, wherein said circuitry for using the pulses further includes circuitry for using a delayed version of said first pulse to sample said first phase of said second cycle.

12. The apparatus of claim 10, wherein said circuitry for using the pulses further includes circuitry for using a third pulse of the sampling pulse signal to sample said first phase of a third cycle of the first communication signal, and wherein said third cycle follows said second cycle.

13. The apparatus of claim 12, wherein said third cycle follows said first cycle by a number of cycles of the first communication signal that is a multiple of said predetermined number.

14. The apparatus of claim 13, wherein said circuitry for using the pulses further includes circuitry for using a delayed version of said first pulse to sample said first phase of said second cycle.

15. The apparatus of claim 12, wherein said circuitry for using the pulses further includes circuitry for using a delayed version of said first pulse to sample said first phase of said second cycle.

16. An apparatus for downconverting a first communication signal at a first frequency into a second communication signal at a second frequency that is lower than the first frequency, comprising:

circuitry for sampling a plurality of phases of each of at least two consecutive cycles of the first communication signal, wherein said sampling includes normally activating a plurality of sampling switches in a first temporal order to sample said plurality of phases, and providing a filter function by activating a plurality of switches in a second temporal order that differs from said first temporal order; and circuitry for combining the sampled phases to provide said filter function and produce the second communication signal.

17. The apparatus of claim 10, wherein said circuitry for producing comprises a sampler, said sampler including a plurality of sampling switches coupled to an input for sampling the first communication signal.

18. The apparatus of claim 10, wherein said circuitry for producing comprises a sampler operable for sampling a plurality of phases of all cycles of the first communication signal.

19. The apparatus of claim 17, including a digital pulse generator coupled to said sampler for producing a sampling pulse signal having a plurality of digital pulses, each of said pulses having a pulse width that is approximately equal to but wider than a half period of the first communication signal, said sampler responsive to said sampling pulse signal for sampling the first communication signal.

20. The apparatus of claim 18, including a digital pulse generator coupled to said sampler for producing a sampling pulse signal having a plurality of digital pulses, each of said pulses having a pulse width that is approximately equal to but wider than a half period of the first communication signal, said sampler responsive to said sampling pulse signal for sampling the first communication signal.

21. The apparatus of claim 19, wherein said sampler has an input for receiving one of said digital pulses and a plurality of delayed versions of said one digital pulse, said sampler responsive to said one digital pulse for sampling one of the phases of said consecutive cycles, and said sampler responsive to said delayed versions of said one pulse for sampling other phases of said consecutive cycles.

22. The apparatus of claim 20, wherein said sampler has an input for receiving one of said digital pulses and a plurality of delayed versions of said one digital pulse, said sampler responsive to said one digital pulse for sampling one of the phases of said consecutive cycles, and said sampler responsive to said delayed versions of said one pulse for sampling other phases of said consecutive cycles.

23. The apparatus of claim 21, further including a delay element structure coupled to said digital pulse generator and said sampler for producing the delayed versions of said one pulse and providing the delayed versions to said sampler input.

24. The apparatus of claim 22, further including a delay element structure coupled to said digital pulse generator and said sampler for producing the delayed versions of said one pulse and providing the delayed versions to said sampler input.

25. The apparatus of claim 21, wherein sand sampler includes a plurality of sampling switches coupled to said first-mentioned input and to said sampler input for respectively sampling phases of said consecutive cycles of the first communication signal in response to said one pulse and said delayed versions of said one pulse.

26. The apparatus of claim 22, wherein sand sampler includes a plurality of sampling switches coupled to said first-mentioned input and to said sampler input for respectively sampling phases of said consecutive cycles of the first communication signal in response to said one pulse and said delayed versions of said one pulse.

27. The apparatus of claim 10, wherein the first communication signal is an RF communication signal.

28. The apparatus of claim 10, wherein the circuitry for using the sampled phases includes filters respectively for receiving selected ones of the sampled phases.

* * * * *